(12) United States Patent
Sauer et al.

(10) Patent No.: US 6,420,660 B1
(45) Date of Patent: Jul. 16, 2002

(54) FILM USED AS A SUBSTRATE FOR INTEGRATED CIRCUITS

(75) Inventors: Veronika Sauer, Hamburg (DE); Ben Slager, Nijmegen (NL); Friedrich Lach, Hasselroth (DE); Alfred Bauer, Alzenau (DE); Horst Hartmann, Hanau (DE); Günter Kolodzei, Karlstein (DE)

(73) Assignee: Koninklijke Philips Electronics, New York, NY (US)

( * ) Notice: Subject to any disclaimer, the term of this patent is extended or adjusted under 35 U.S.C. 154(b) by 0 days.

(21) Appl. No.: 09/445,235

(22) PCT Filed: Apr. 7, 1999

(86) PCT No.: PCT/IB99/00591

§ 371 (c)(1),
(2), (4) Date: Dec. 8, 1999

(87) PCT Pub. No.: WO99/53545

PCT Pub. Date: Oct. 21, 1999

(30) Foreign Application Priority Data

Apr. 9, 1998 (DE) .......................................... 198 16 066

(51) Int. Cl.$^7$ ................................................. H05K 1/02
(52) U.S. Cl. ..................................... 174/259; 361/813
(58) Field of Search .............................. 174/268, 254, 174/259; 361/813; 257/666, 668, 679; 235/492, 488; 340/572.1, 572.2–572.9; 438/107, 110, 111, 113, 121, 123; 29/829, 827, 825, 846, 830, 831

(56) References Cited

U.S. PATENT DOCUMENTS 3,547,724 A * 12/1970 Zagusta ....................... 156/233
4,313,152 A * 1/1982 Vranken ...................... 361/402
4,356,627 A * 11/1982 Hoffman ........................ 29/849
4,555,291 A * 11/1985 Tait et al. .................... 156/250
5,023,751 A * 6/1991 Stampfli ....................... 361/398
5,119,070 A * 6/1992 Matsumoto et al. ......... 340/572
5,545,922 A * 8/1996 Golwalkar et al. .......... 257/676
5,550,402 A * 8/1996 Nicklaus ...................... 257/669
5,745,988 A * 5/1998 Hohmann et al. ............. 29/841
6,025,283 A * 2/2000 Roberts ........................ 442/15
6,066,231 A * 5/2000 Maestri et al. ........... 156/379.8

FOREIGN PATENT DOCUMENTS

JP            63-44732    *  2/1988

* cited by examiner

*Primary Examiner*—Brian Sircus
*Assistant Examiner*—Son V. Nguyen
(74) *Attorney, Agent, or Firm*—Theodorus N. Mak

(57) ABSTRACT

The chips for chip cards are customarily provided on a film strip which consists of a synthetic foil and a conductor track pattern and are connected to the conductor track pattern by way of bonding wires. Automatic mounting is made possible by the use of a film strip with periodically arranged conductor track patterns. For chips which can be driven via contacts as well as in a contactless manner, using a coil, conductor tracks are effectively provided on both sides of the synthetic foil forming the film strip. However, the film strip then becomes very inflexible so that it cannot be suitably handled by conventional automatic apparatus. The invention proposes to provide the metal foils wherefrom the conductor tracks are cut out with additional interruptions which reduce the cross-section of the metal foils at short intervals in the direction perpendicular to the longitudinal direction of the film. The film strip thus becomes more flexible so that it can be handled by conventional automatic apparatus.

4 Claims, 8 Drawing Sheets

FILM USED AS A SUBSTRATE FOR INTEGRATED CIRCUITS

TECHNICAL FIELD

The invention relates to a foil in the form of an elongate film strip with edge perforations and conductor tracks which serves as a carrier for a plurality of integrated circuits to be incorporated preferably in chip cards, the conductor tracks being cut out from a metal foil and glued onto a synthetic foil provided with holes or openings.

Foils of this kind are generally known and serve to minimize the complexity and hence cost of manufacture of chip cards. Because the foil is formed as an elongate film strip with a periodic configuration of the same conductor track pattern, the integrated circuits can be deposited and contacted by means of an automatic apparatus. Subsequently, the integrated circuits with the surrounding conductor track pattern are cut out from the film strip as one unit so as to be incorporated in the appropriate parts of the chip cards. The conductor track pattern at the same time serves for the contacting of the integrated circuit from outside the chip card.

BACKGROUND

Since recently integrated circuits are known which can be operated not only via contacts but also in a contactless manner, that is to say inductively via a coil. This coil is separately incorporated in the chip card and connected to the separate terminals of the integrated circuit. This connection can be realized by connecting the ends of the coil directly to appropriate terminals of the integrated circuit. Such a connection, however, has various drawbacks; notably the integrated circuit is then severely loaded from a mechanical point of view so that it could be damaged.

Another possibility consists in providing a further metal foil with an appropriate conductor track pattern on the synthetic foil, so that the synthetic foil is covered with a conductor track pattern on both sides, one conductor track pattern serving only to establish a connection between the coil and the integrated circuit. However, it has been found that such a synthetic foil with conductor tracks on both sides is much more rigid than a foil of this kind which is provided with conductor tracks on one side only, so that it cannot be readily handled by the customary automatic apparatus or gives rise to disruptions during operation.

SUMMARY

It is an object of the invention to construct a foil in the form of an elongate film strip provided with edge perforations and conductor tracks of the kind set forth in such a manner that it is suitable to accommodate integrated circuits which can be operated via contacts as well as in a contactless manner, the film strip nevertheless remaining as flexible as possible.

This object is achieved according to the invention in that a respective metal foil with different conductor track patterns is glued to each side of the synthetic foil, and that the metal foils on both sides comprise, in addition to the specified conductor track pattern, interruptions in order to achieve a significant reduction of the overall cross-section of both metal foils at short intervals in the longitudinal direction of the foil strip, perpendicularly to the longitudinal direction of the film strip.

As a result of the reduction of the cross-section in both conductor tracks, the film strip remains so flexible in the longitudinal direction that it can be readily handled by contemporary automatic apparatus without causing significant disturbances. The fact should be taken into account that the dimensions and the shape of the conductor tracks in the contact field, via which the integrated circuit is driven by way of contacts, are predetermined to a high degree. Moreover, in the case of a conductor track pattern which is cut out from a metal foil and subsequently glued onto a synthetic foil each part of the conductor track must be connected to the other parts. This also holds for a subsequent surface enhancement of the conductor tracks. However, via appropriate configuration it can be ensured that connections in the conductor track pattern extend essentially transversely of the longitudinal direction of the film strip, so that the conductor track pattern can be provided with interruptions which reduce the overall cross-section of both metal foils perpendicularly to the longitudinal direction of the film strip each time at short intervals.

In order to achieve a defined position on the synthetic foil during the gluing on the metal foil with the cut out conductor track pattern, the synthetic foil as well as the metal foil is provided with edge perforations which are used for alignment. The edge strip of the two metal foils with the edge perforations, however, leads to increased rigidity in the longitudinal direction of the film strip. In order to reduce such rigidity, in a further embodiment of the invention both metal foils are provided, at corresponding locations at the area of the edge perforations, with an opening which extends over a plurality of successive edge perforations. It has been found that it suffices to perform alignment on the basis of a few edge perforations only, notably on the basis of a respective edge perforation for each conductor track pattern associated with an integrated circuit.

If, instead of the described approach, a further version of the alignment procedure is used which utilizes every edge perforation, it may be advantageous; when the foil according to the invention is conceived accordingly, to provide an opening in at least one metal foil at the area of the edge perforations, which opening extends between every two successive edge perforations but does not contact the edge perforations. It may then suffice when only one of the two metal foils is provided with said openings at the area of the edge perforations. A particularly high flexibility is obtained, however, by providing both metal foils, in corresponding locations at the area of the edge perforations, with openings which extend between each time two successive edge perforations but do not contact the edge perforations.

These embodiments of the foil according to the invention offer advantages, notably for the manufacture of chip cards, when all edge perforations are used for the optical centering of the foil during its mounting in the chip card. In that case it is advantageous when all edge perforations are uniformly bordered by parts of at least one of the metal foils. However, when edge perforations with borders of metal foil as well as edge perforations with borders of merely synthetic foil are used for the optical centering of the foil, the different optical transparency of the edge perforations and their borders must be taken into account in the case of automatic centering. The latter embodiment of the foil according to the invention creates circumstances which can then be particularly simply controlled.

BRIEF DESCRIPTION OF THE DRAWINGS

Embodiments of the invention will be described in detail hereinafter with reference to the drawing. Therein.

DETAILED DESCRIPTION

Figure 1:
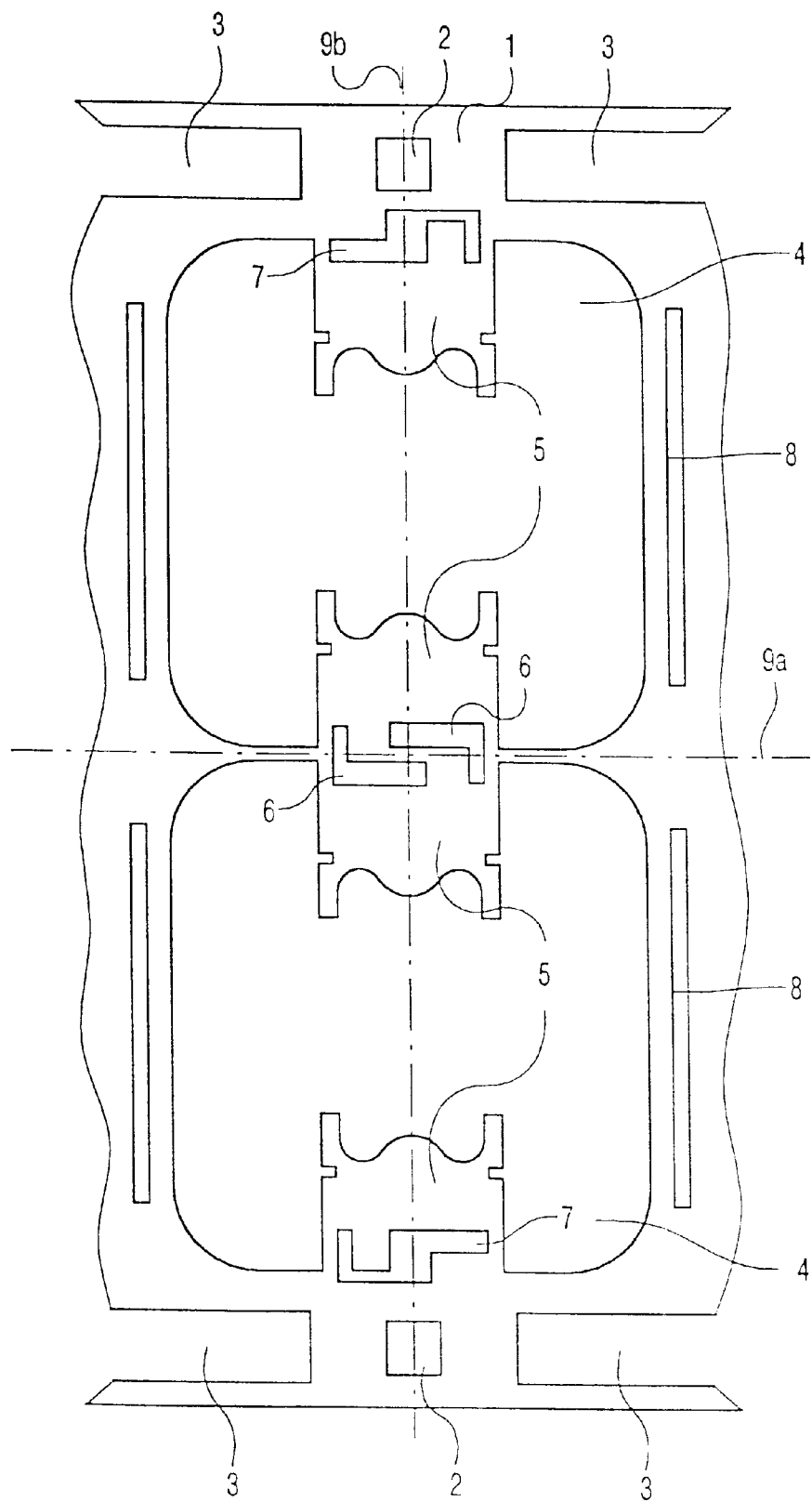
FIG. 1 shows a conductor track pattern for the connection of the coil.

FIG. 1 shows a metal foil 1 with a conductor track pattern for two adjacent integrated circuits. This conductor track pattern is periodically repeated to both sides of the conductor track pattern shown.

The pattern shown is rotationally symmetrical with respect to the point of intersection of the two axes 9a and 9b. To both sides of the axis 9a the metal foil 1 is provided with edge perforations 2 which are made to register with corresponding edge perforations in the synthetic foil during gluing on. To both sides of the edge perforations 2 there are provided openings 3 in which further edge perforations of the synthetic foil are situated as will be described hereinafter. The openings 3 significantly reduce the cross-section of the metal foil 1 in the direction parallel to the axis 9b, so that the flexibility in the longitudinal direction of the film strip, i.e. in the direction of the axis 9a, remains comparatively high after the deposition of the foil 1 on the synthetic foil.

Between the edge perforations 2 and the openings 3 at the top and the bottom there are provided openings 4 which are bounded by bridges in the metal foil 1 and are slightly larger than the part which, after the deposition of the metal foils on the synthetic foils and the insertion and contacting of integrated circuits, is cut out so as to be inserted into a chip card.

Projections 5 which form the contact faces for the connection of the two ends of a coil as well as the bonding wires of the integrated circuit after insertion project into the openings 4. Due to the openings 6 and 7 in the metal foil 1, the projections 5 are connected to the remainder of the metal foil 1 only via narrow bridges in order to ensure that on the one hand, after cutting out, the connection between the projections 5 and other parts of the metal foil 1 is reliably interrupted and that on the other hand the flexibility in the longitudinal direction, parallel to the axis 9a, is also improved.

Figure 2:
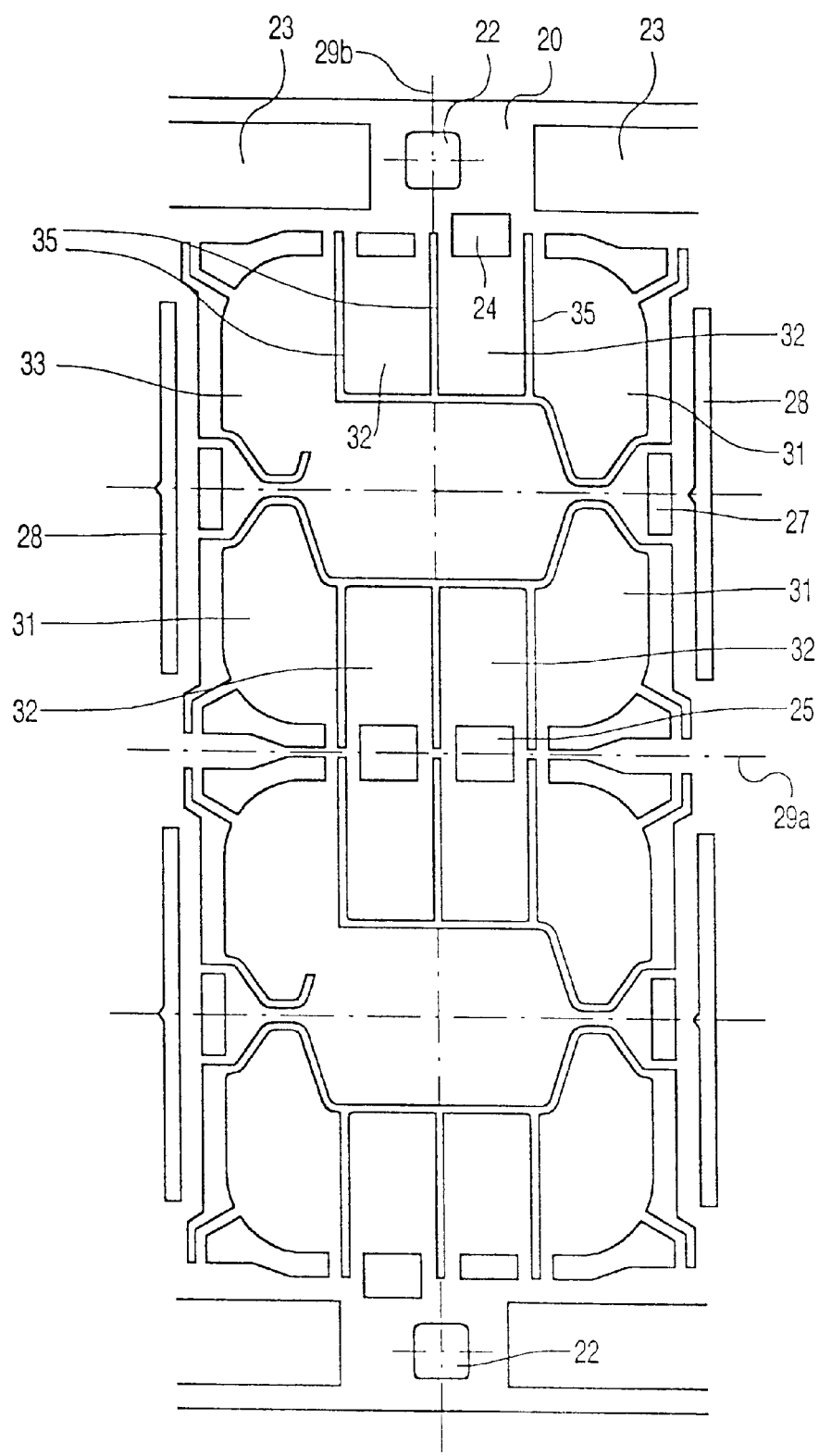
FIG. 2 shows a conductor track pattern for the contact field.

The distance between the openings 4 is defined by the spacing of the edge perforations in the synthetic foil and the dimensions of the contact field which is shown in detail in FIG. 2. In order to reduce the cross-section of the metal foil 1 at least at short intervals between the openings 4 which succeed one another in the longitudinal direction there is provided an opening 8 whereby the flexibility in the longitudinal direction, parallel to the axis 9a, is further improved.

FIG. 2 shows the conductor track pattern for the side of the contact field. This conductor track pattern is formed by a metal foil 20 cut out accordingly. The pattern shown is again periodically repeated to both sides of the pattern shown, i.e. in the direction of the axis 29a.

This conductor track pattern again includes edge perforations 22 to both sides, which perforations are adjoined by larger openings 23 to both sides in the longitudinal direction in order to improve the flexibility. The edge perforations 22 and the openings 23 correspond to those in the conductor track pattern shown in FIG. 1.

In conformity with the conductor track pattern of FIG. 1, two identical conductor track patterns for two integrated circuits are again situated therebetween. This conductor track pattern comprises essentially contact faces 31, 32 and 33 which are separated from one another by narrow interruptions 35. They are connected to one another via narrow bridges only at the area of the edges and at the area of the central axis 29a. These bridges are interrupted during the afore-mentioned cutting out after the deposition of the integrated circuits. The individual contact faces 31, 32 and 33 have a predetermined shape.

Also provided are openings 24 and 25 which reduce the cross-section in the direction parallel to the axis 29b.

Between conductor track patterns which adjoin one another in the longitudinal direction there is again provided an opening 28 which increases the flexibility in the longitudinal direction, parallel to the axis 29a.

Figure 3:
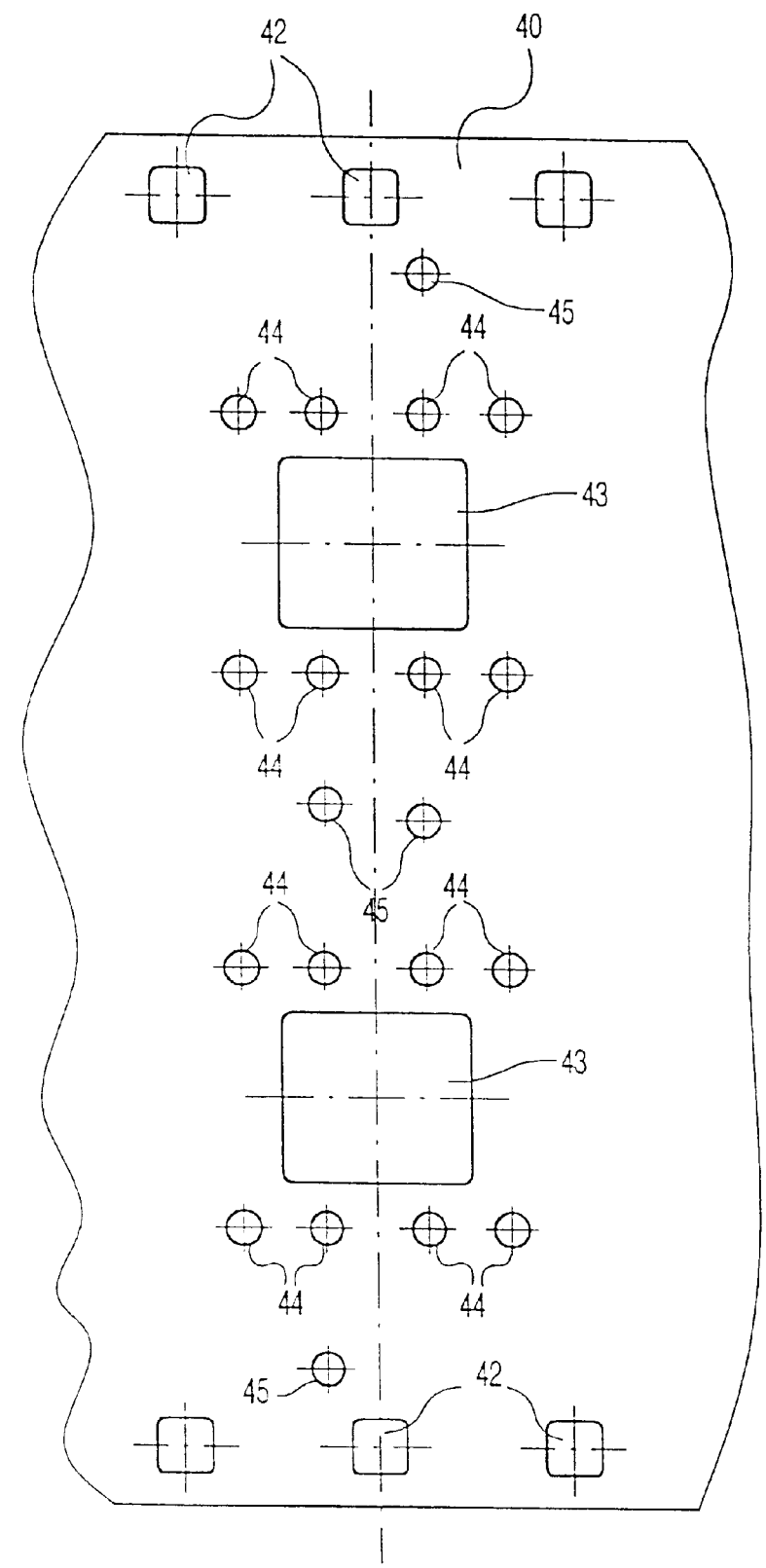
FIG. 3 shows a pattern of openings in the synthetic foil.

FIG. 3 shows a section of a synthetic foil 40 onto which the metal foils shown in the FIGS. 1 and 2 are glued. The synthetic foil 40 is shaped as a film strip and is provided with edge perforations 42 which are regularly repeated at a distance which is smaller than the period of the conductor track patterns. Between the edges there are shown two openings 43 which, after the metal foil 20 has been glued on, are covered by the conductor track face 33 and in which the integrated circuit is provided on this conductor track face. Furthermore, to both sides of the opening 43 there is provided a row of holes 44 which are covered by the conductor track faces 31, 32, 33 after the metal foil 20 has been glued on and whereby, after the insertion of the integrated circuit, the contacts thereof are connected to these conductor track segments via bonding wires. Also provided are holes 45 which are covered by the appropriate parts of the projections 5 of the metal foil 1.

Figure 4:
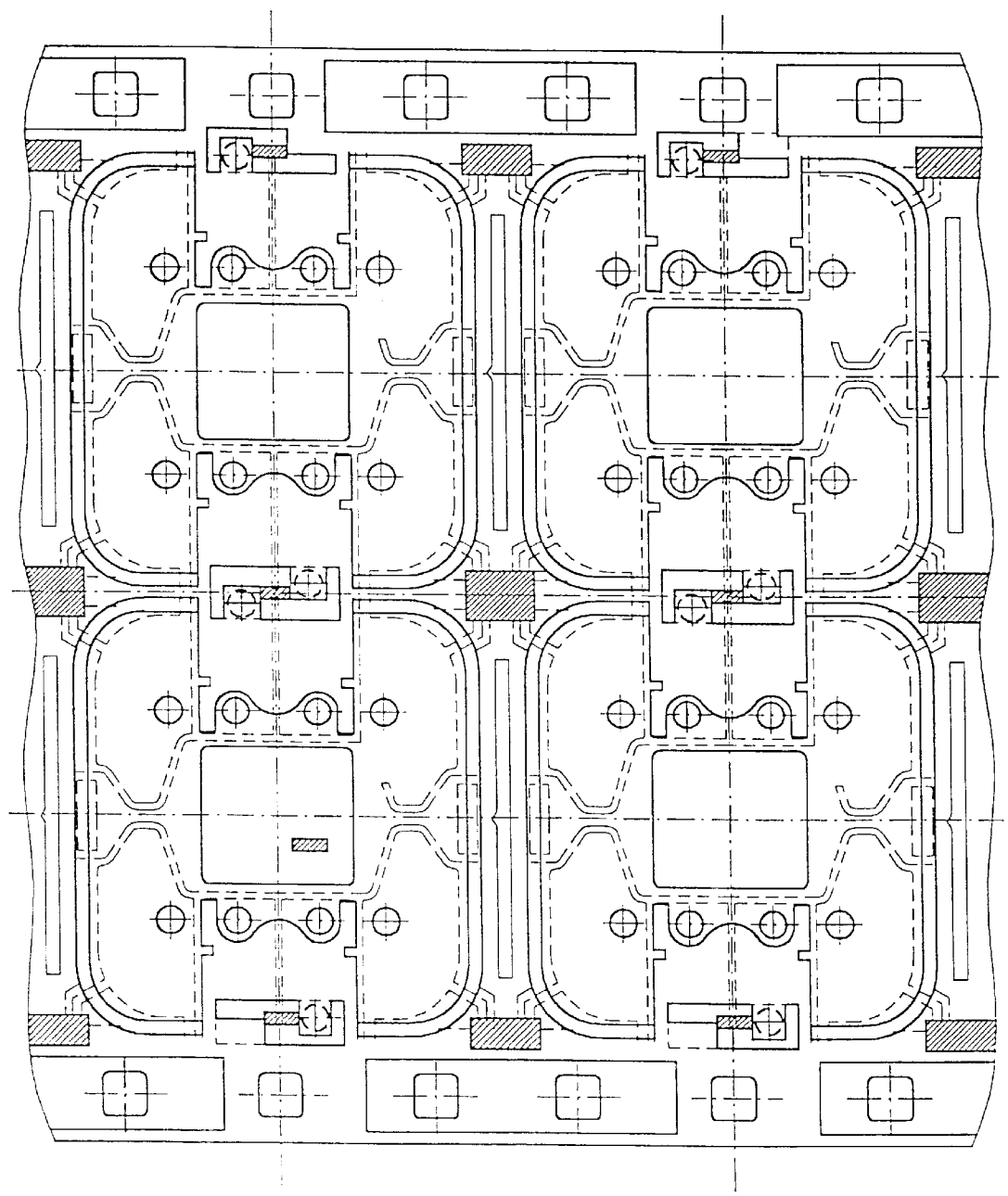
FIG. 4 shows the synthetic foil with glued on conductor tracks. and for a second embodiment.

FIG. 4 shows a part of a film strip where the metal foils shown in the FIGS. 1 and 2, provided with the corresponding conductor track patterns, have been glued onto the synthetic foil shown in FIG. 3. FIG. 4 is a plan view of the conductor track pattern of the metal foil 1. For the sake of clarity two neighboring conductor track patterns are shown for two integrated circuits each. It can be seen that the openings 3, 23 in the metal foils 1 and 20, respectively, extend across two edge perforations in the synthetic foil 40 of FIG. 3. The position of the openings 43 in FIG. 3 over the conductor face 33 in FIG. 2 and the position of the holes 44 in FIG. 3 over the corresponding conductor faces 31, 32 and 33 in FIG. 2, denoted by dashed lines in FIG. 4, can be recognized. Furthermore, the thin line outside the conductor track faces, denoted by dashed lines, represents the cutting line.

The second embodiment which is shown in the FIGS. 5 to 8 is distinct from the described embodiment shown in the FIGS. 1 to 4 only in respect of a few structural characteristics which will be described in detail hereinafter. The other characteristics of the two embodiments correspond.

Figure 5:
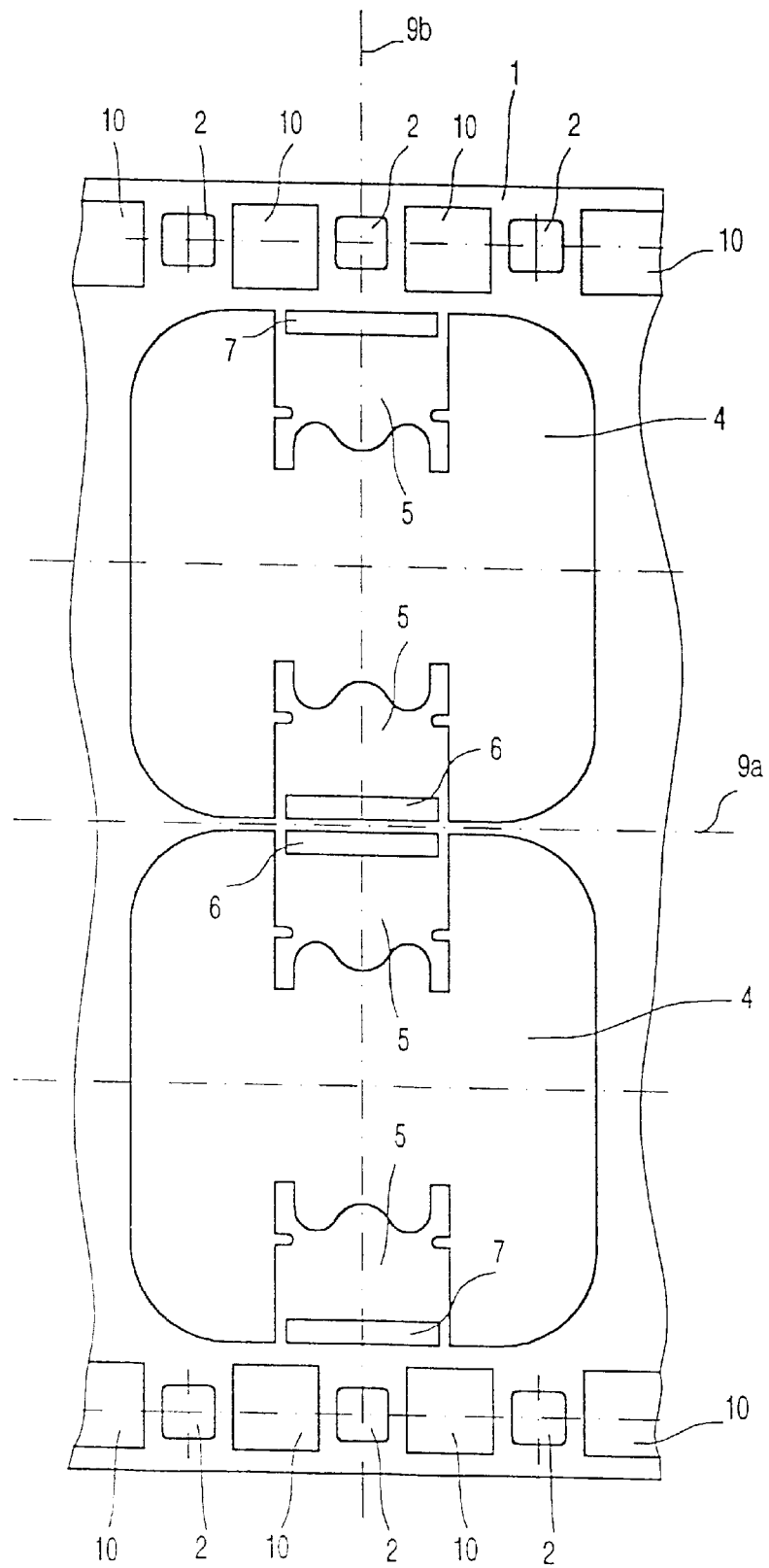
FIG. 5 shows a conductor track pattern for the connection of the coil.

The conductor track pattern of the second embodiment as shown in FIG. 5 deviates first of all in that, instead of the openings 3, there are now provided openings 10 which extend between each time two successive edge perforations 2, but do not contact these perforations, so that each of the edge perforations 2 is fully surrounded by metal foil. In the case of optical centering, therefore, all edge perforations 2 have a corresponding structure. In comparison with the first embodiment described, the openings 10 significantly reduce the cross-section of the metal foil in this embodiment in the direction parallel to the axis 9*b*.

For the second embodiment a modified contour was also selected for the openings 6, 7; however, in principle this has no effect on the flexibility of the foil according to the invention.

Moreover, the openings 8 shown in FIG. 1 are absent in the rendition of FIG. 5. However, such openings may be provided as well for the second embodiment.

Figure 6:
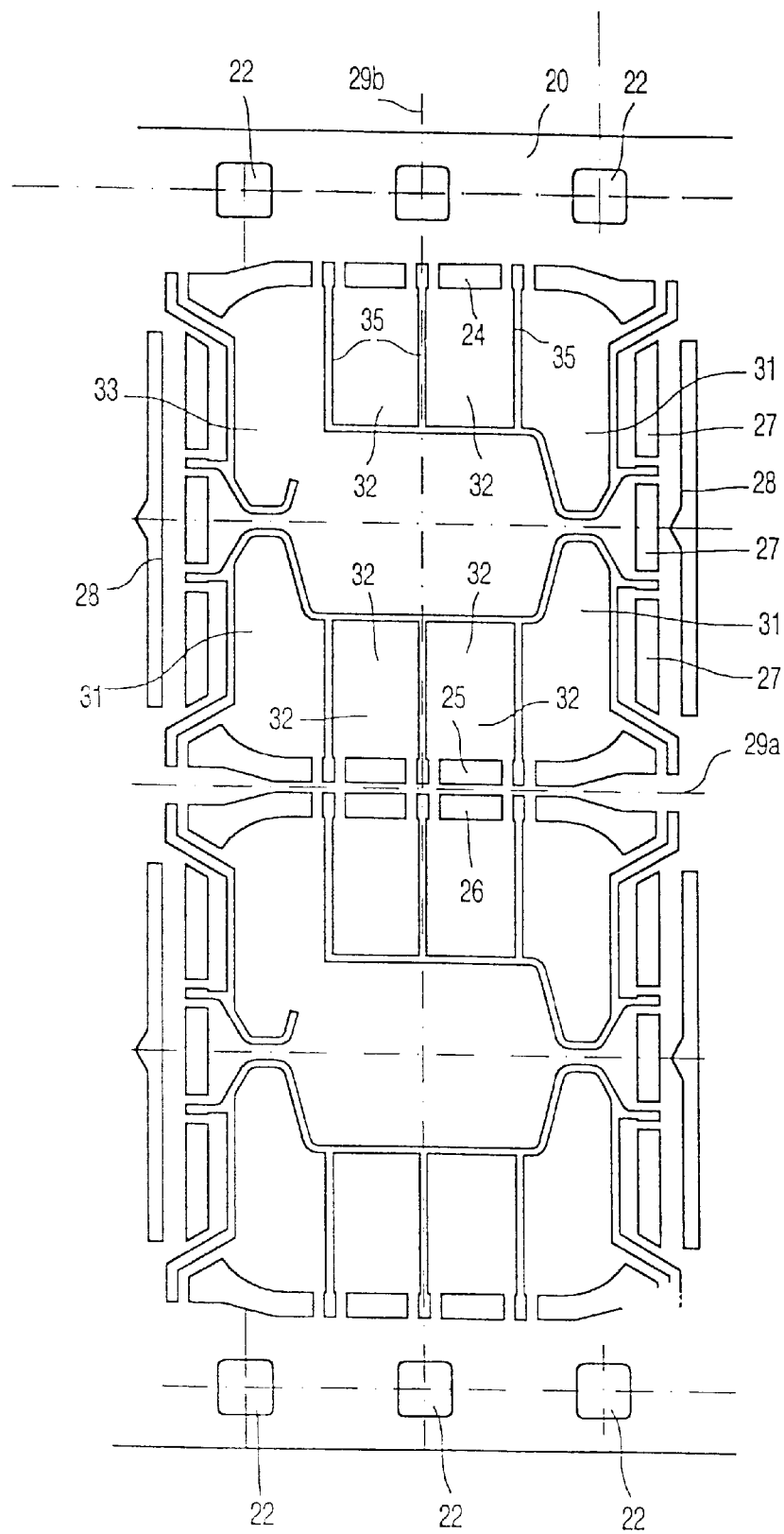
FIG. 6 shows a conductor track pattern for the contact field.

FIG. 6 shows the conductor track pattern for the side of the contact field of the second embodiment. In this case no openings are provided between the edge perforations 22. If desired, however, in this case there may also be provided openings which are preferably provided in the finished foil so as to register with the openings 10 in the conductor track pattern shown in FIG. 5. In any case all edge perforations 22 have a uniform border of metal foil.

The contact faces 31, 32, 33 in the second embodiment are formed in conformity with a standard which deviates from that used for the first embodiment and is applied notably in France. Notably the contact faces 31 and 33 are constructed so as to be narrower. In order to keep the neighboring parts of the metal foil 20 flexible nevertheless, in FIG. 6 three openings 27 are provided between the opening 28 and the contact faces 31 and 33, parallel to the axis 29*b*, in addition to the single opening 27 in FIG. 2 at the level of the center of the contact field consisting of the contact faces 31, 32, 33. The axis 29*b* registers with the axis 9*b* in FIG. 5 in the assembled condition of the foil according to the invention.

The contours of the openings 24 and 25 are also slightly modified. Instead of the openings 25 used thus far in FIG. 2, there are provided two openings 25, 26 which are symmetrically situated relative to the axis 29*a*.

Figure 7:
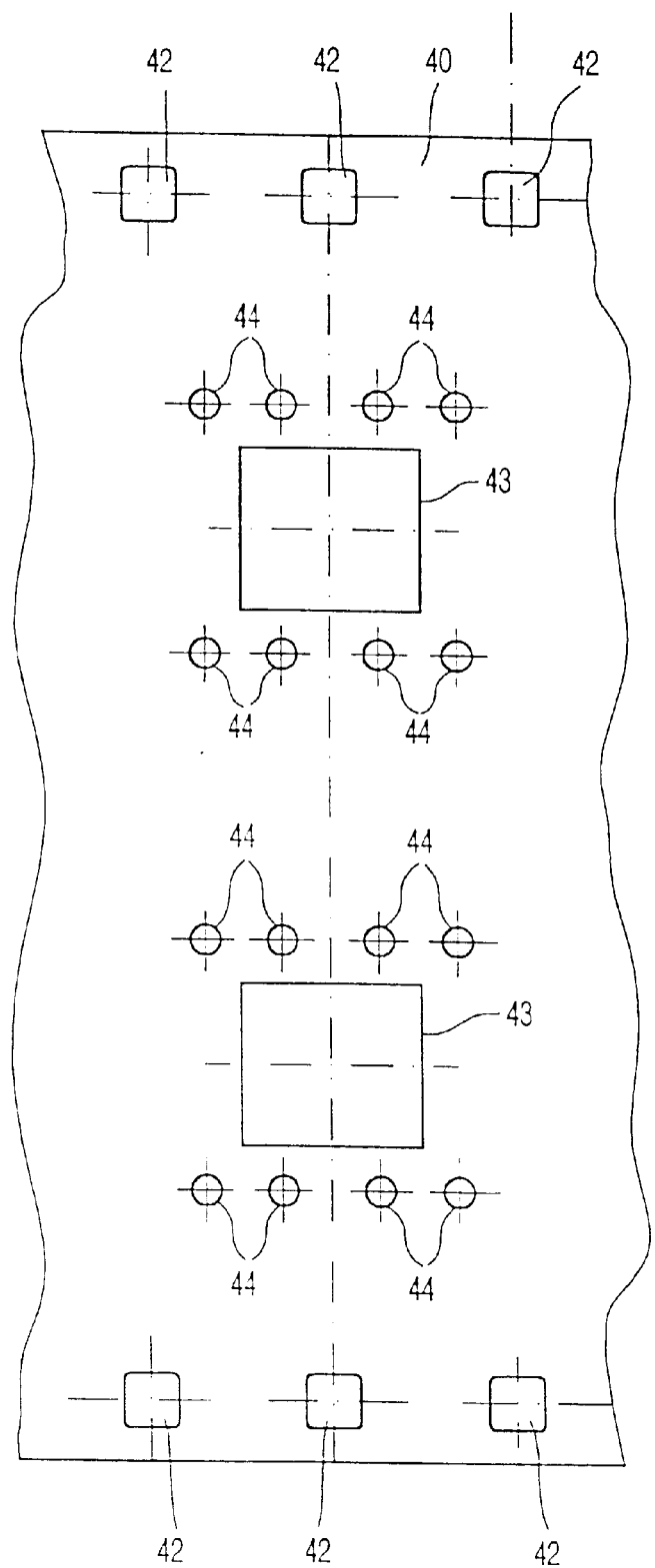
FIG. 7 shows a pattern of openings in the synthetic foil.

The synthetic foil 40 of the second embodiment shown in FIG. 7 deviates from the synthetic foil 40 shown in FIG. 3 merely in that the holes 45 are absent. Like the openings 3 and 23 in the first embodiment, the openings 10 which are larger than the edge perforations are not provided in the synthetic foil 40 in the second embodiment.

Figure 8:
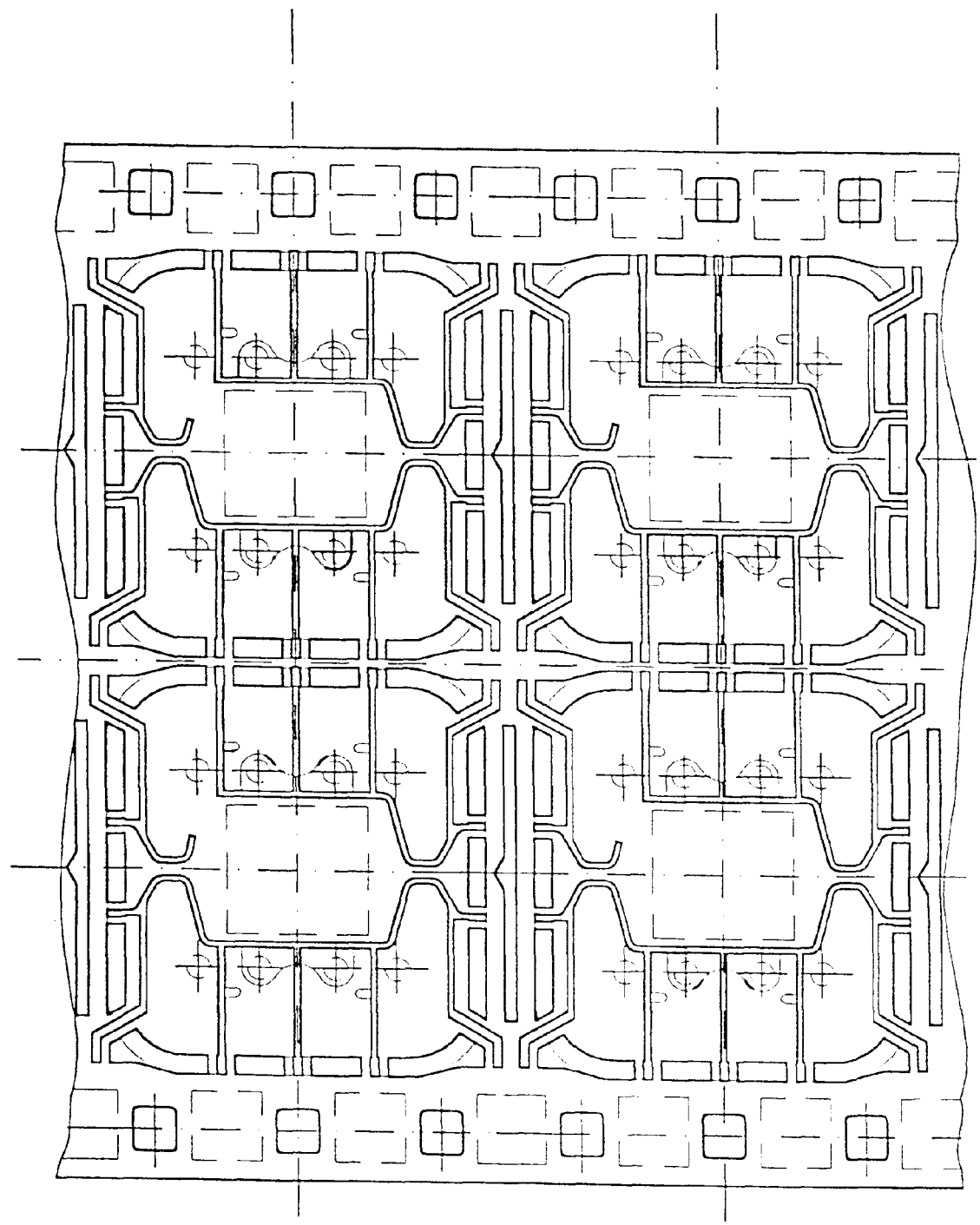
FIG. 8 shows the synthetic foil with glued on conductor tracks.

FIG. 8 shows a part of a film strip where the metal foils 1 and 20 with the corresponding conductor track patterns, shown in the FIGS. 5 and 6, are glued onto the synthetic foil 40 shown in FIG. 7. For the second embodiment FIG. 8 shows the plan view of the conductor track pattern of the metal foil 20; for the sake of clarity, again two neighboring conductor track patterns are shown for each time every two integrated circuits. The conductor track patterns of the metal foil 1 and the contours of the synthetic foil 40 are denoted by dashed lines at the areas where they are covered by the foils provided thereon, notably the metal foil 20.

What is claimed is:

1. A foil in the form of an elongate film strip with edge perforations and two or more conductor tracks, which serves as a carrier for a plurality of integrated circuits, each of the conductor tracks being cut out from one or more metal foils and glued onto a synthetic foil provided with holes or openings, comprising a metal foil (1, 20) with different conductor track patterns glued to each side of the synthetic foil (40), wherein the metal foils on both sides comprise, in addition to the conductor tracks, interruptions (3, 4, 6, 7, 23, 24, 25, 27, 28) in order to achieve a significant reduction of the overall cross-section of both metal foils (1, 20) at short intervals in the longitudinal direction of the elongate film strip.

2. A foil as claimed in claim 1, wherein the synthetic foil (40) comprises edge perforations (42) at regular intervals, and wherein both metal foils (1, 20) are provided, at corresponding locations of the edge perforations (42), with an opening (3, 23) that extends over a plurality of successive edge perforations (42).

3. A foil as claimed in claim 1, wherein the synthetic foil (40) is provided with edge perforations (2, 22, 42) at regular intervals, and wherein at least one metal foil (1) is provided, at corresponding locations of the edge perforations (2, 22, 42), with at least one opening (10) that extends each time between two successive edge perforations (2, 22, 42) but does not contact the edge perforations (2, 22, 42).

4. A foil as claimed in claim 3, wherein both metal foils (1, 20) are provided, in corresponding locations at the area of the edge perforations (2, 22, 42), with openings (10) that extend between each time two successive edge perforations (2, 22, 42) but do not contact the edge perforations (2, 22, 42).

* * * * *